United States Patent
Jang et al.

(10) Patent No.: US 10,977,990 B2
(45) Date of Patent: Apr. 13, 2021

(54) PIXEL AND ORGANIC LIGHT EMITTING DISPLAY DEVICE COMPRISING THE SAME

(71) Applicant: Samsung Electronics Co., Ltd., Suwon-si (KR)

(72) Inventors: Yeong Shin Jang, Osan-si (KR); Seung Hee Kuk, Hwaseong-si (KR); Si Woo Kim, Suwon-si (KR); Won Seok Kim, Seongnam-si (KR); Jung Moon Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 11 days.

(21) Appl. No.: 16/243,609

(22) Filed: Jan. 9, 2019

(65) Prior Publication Data

US 2019/0392757 A1    Dec. 26, 2019

(30) Foreign Application Priority Data

Jun. 20, 2018 (KR) .................. 10-2018-0071088

(51) Int. Cl.
  *G09G 3/3233* (2016.01)
  *H01L 27/32* (2006.01)
  (Continued)

(52) U.S. Cl.
  CPC ......... *G09G 3/3233* (2013.01); *G09G 3/3266* (2013.01); *G09G 3/3275* (2013.01);
  (Continued)

(58) Field of Classification Search
  CPC ......... G09G 3/3233–3291; G09G 2300/0408; G09G 2300/0426; G09G 2300/0439;
  (Continued)

(56) References Cited

U.S. PATENT DOCUMENTS 8,477,085 B2 * 7/2013 Shishido .............. G09G 3/3233
                                                         315/169.3
9,129,927 B2   9/2015 Gupta et al.
(Continued)

FOREIGN PATENT DOCUMENTS

KR   10-2016-0018825 A   2/2016
KR   10-2018-0004369 A   1/2018
(Continued)

OTHER PUBLICATIONS

Notice of Allowance dated Feb. 13, 2020 in copending, related U.S. Appl. No. 16/251,781.

*Primary Examiner* — Nathan Danielsen
(74) *Attorney, Agent, or Firm* — Lee IP Law, PC (57) ABSTRACT

A pixel includes an organic light emitting diode (OLED); a first transistor between a driving power and a first node, having a gate connected to a control line; a second transistor between the first node and a second node, having a gate connected to a second electrode of a seventh transistor; a third transistor between the second node and an anode electrode of the OLED, having a gate connected to the control line; a fourth transistor between the first node and a data line; a fifth transistor between the second node and a storage capacitor; a sixth transistor between an initialization power and the anode electrode, the fourth to sixth transistors having gates connected to a scan line; the seventh transistor connected to the initialization power and the gate of the second transistor, having a gate connected to another scan line, all transistors being oxide semiconductor thin film transistors.

10 Claims, 4 Drawing Sheets

(51) Int. Cl.
  *G09G 3/3266* (2016.01)
  *G09G 3/3275* (2016.01)
  *H01L 27/12* (2006.01)
  *H01L 29/786* (2006.01)
  *H01L 29/24* (2006.01)

(52) U.S. Cl.
  CPC . *H01L 27/3262* (2013.01); *G09G 2300/0809* (2013.01); *H01L 27/124* (2013.01); *H01L 27/1225* (2013.01); *H01L 27/1251* (2013.01); *H01L 27/1255* (2013.01); *H01L 29/24* (2013.01); *H01L 29/7869* (2013.01); *H01L 29/78672* (2013.01)

(58) Field of Classification Search
  CPC ... G09G 2300/0469; G09G 2300/0809; G09G 2300/0842; G09G 2300/0852; G09G 2300/0861; G09G 2310/0205–021; G09G 2330/021; G09G 2330/023; H01L 27/1222; H01L 27/1225; H01L 27/124; H01L 27/1251; H01L 27/1255; H01L 27/326; H01L 27/3262; H01L 27/3265; H01L 27/3276; H01L 29/24; H01L 29/78672–29/78678; H01L 29/7869
  See application file for complete search history.

(56) References Cited

U.S. PATENT DOCUMENTS

| | | | |
|---|---|---|---|
| 9,276,050 B2 | 3/2016 | Kwon et al. | |
| 9,412,799 B2 | 8/2016 | Chang et al. | |
| 9,564,478 B2 | 2/2017 | Chang et al. | |
| 9,627,462 B2 | 4/2017 | Kwon et al. | |
| 9,634,038 B2 | 4/2017 | Kwon et al. | |
| 9,818,765 B2 | 11/2017 | Osawa et al. | |
| 2012/0001893 A1 | 1/2012 | Jeong et al. | |
| 2012/0162177 A1* | 6/2012 | Lee | G09G 3/3266 345/211 |
| 2012/0235965 A1 | 9/2012 | Pai | |
| 2013/0222356 A1 | 8/2013 | Jeong et al. | |
| 2014/0035797 A1* | 2/2014 | Jinta | G09G 3/3233 345/77 |
| 2015/0055047 A1 | 2/2015 | Chang et al. | |
| 2015/0243220 A1 | 8/2015 | Kim et al. | |
| 2015/0364089 A1* | 12/2015 | Pyo | G09G 3/3258 345/77 |
| 2016/0005384 A1* | 1/2016 | Yoon | G09G 3/3233 345/213 |
| 2016/0035812 A1* | 2/2016 | Kwon | H01L 27/3276 257/40 |
| 2016/0063921 A1* | 3/2016 | Tsai | G09G 3/3233 345/76 |
| 2016/0210898 A1* | 7/2016 | Tsuge | G09G 3/3233 |
| 2017/0186782 A1* | 6/2017 | Lee | H01L 27/1225 |
| 2017/0221422 A1* | 8/2017 | Hwang | G09G 3/3233 |
| 2018/0006099 A1 | 1/2018 | Ka et al. | |
| 2018/0033367 A1* | 2/2018 | Kim | H01L 27/3248 |
| 2018/0047336 A1* | 2/2018 | Chen | G09G 3/3266 |

FOREIGN PATENT DOCUMENTS

| | | | | |
|---|---|---|---|---|
| WO | WO 2015/031037 A1 | 3/2015 | | |
| WO | WO-2015029422 A1 * | 3/2015 | ........... | G09G 3/3258 |
| WO | 10-2015-0100516 A | 9/2015 | | |
| WO | WO-2015198597 A1 * | 12/2015 | ........... | G09G 3/3233 |

* cited by examiner

PIXEL AND ORGANIC LIGHT EMITTING DISPLAY DEVICE COMPRISING THE SAME

CROSS-REFERENCE TO RELATED APPLICATION

Korean Patent Application No. 10-2018-0071088 filed on Jun. 20, 2018 in the Korean Intellectual Property Office, and entitled: "Pixel and Organic Light Emitting Display Device Comprising the Same," is incorporated by reference herein in its entirety.

BACKGROUND

1. Field

Embodiments relate to a pixel and an organic light emitting display device including the pixel.

2. Description of the Related Art

An organic light emitting device displays an image using an organic light emitting diode (OLED) generating light by the recombination of electrons and holes. Such an organic light emitting device is advantageous, in that the organic light emitting device has a fast response speed while being driven with low power consumption.

The organic light emitting device has a plurality of pixels connected to a plurality of data lines and a plurality of scan lines. Each pixel includes an organic light emitting diode and a driving transistor for controlling an amount of current flowing to an organic light emitting diode.

SUMMARY

According to an aspect, a pixel includes an organic light emitting diode; a first transistor having a first electrode connected to a driving power source, a second electrode connected to a first node, and a gate electrode connected to a light emitting control line, a second transistor connected between the first node and a second node, and having a gate electrode connected to a second electrode of a seventh transistor, a third transistor connected between the second node and an anode electrode of the organic light emitting diode, and having a gate electrode connected to the light emitting control line, a fourth transistor connected between the first node and a data line, and a having a gate electrode connected to a first scan line, a fifth transistor connected between the second node and a storage capacitor, and having a gate electrode connected to the first scan line, a sixth transistor connected between an initialization power source and the anode electrode of the organic light emitting diode, and having a gate electrode connected to the first scan line, the seventh transistor having a first electrode connected to the initialization power source, a second electrode connected to the gate electrode of the second transistor, and a gate electrode connected to a second scan line, and the storage capacitor connected between the driving power source and the fifth transistor, wherein the first transistor to the seventh transistor are formed of a P-type oxide semiconductor thin film transistor.

According to an aspect, a pixel includes an organic light emitting diode, a first transistor including a first electrode connected to a driving power source, a second electrode connected to a first node, and a gate electrode connected to a second node, a second transistor connected between a data line and the second node, and having a gate electrode connected to a second scan line, a third transistor connected between the first node and a reference voltage line, and having a gate electrode connected to a third scan line, a fourth transistor connected between the first node and an anode electrode of the organic light emitting diode, and having a gate electrode connected to a first scan line, and a storage capacitor is connected between the first node and the second node, wherein the first transistor to the fourth transistor are oxide semiconductor thin film transistors.

According to an aspect, a pixel includes an organic light emitting diode, a first transistor including a first electrode connected to a second electrode of a fourth transistor, a second electrode connected to a first node, and a gate connected to a second node, a second transistor connected between a data line and the second node, and having a gate electrode connected to a first scan line, a third transistor connected between the first node and a reference voltage line, and having a gate electrode connected to a third scan line, the fourth transistor including a first electrode connected to a driving power source, the second electrode connected to the first electrode of the first transistor, and a gate electrode connected to a second scan line, and a storage capacitor connected between the first node and the second node, wherein the first transistor to the fourth transistor are oxide semiconductor thin film transistors.

According to an aspect, a pixel includes an organic light emitting diode, a first transistor including a first electrode connected to a second electrode of a fifth transistor, a second electrode connected to a first node, and a gate electrode connected to a second node, a second transistor connected between a data line and the second node, and having a gate electrode connected to a second scan line, a third transistor connected between the first node and a reference voltage line, and having a gate electrode connected to a fourth scan line, a fourth transistor connected between the first node and an anode electrode of the organic light emitting diode, and having a gate electrode connected to a first scan line, the fifth transistor having a first electrode connected to a driving power source, the second electrode connected to the first electrode of the first transistor, and a gate electrode connected to a third scan line, a storage capacitor connected between the first node and the second node, wherein the first transistor to the fifth transistor are oxide semiconductor thin film transistors.

According to an aspect, an organic light emitting display device includes an organic light emitting display panel including a plurality of data lines, a plurality of scan lines, and a plurality of pixels; a data driver driving the plurality of data lines by supplying a data voltage to the plurality of data lines; a scan driver sequentially driving the plurality of scan lines by sequentially supplying scan signals to the plurality of scan lines; and a controller controlling the data driver and the scan driver by supplying a control signal to the data driver and the scan driver, wherein a transistor included in each of the plurality of pixels is only formed of an oxide semiconductor thin film transistor.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be described with reference to the accompanying drawings.

Figure 1:
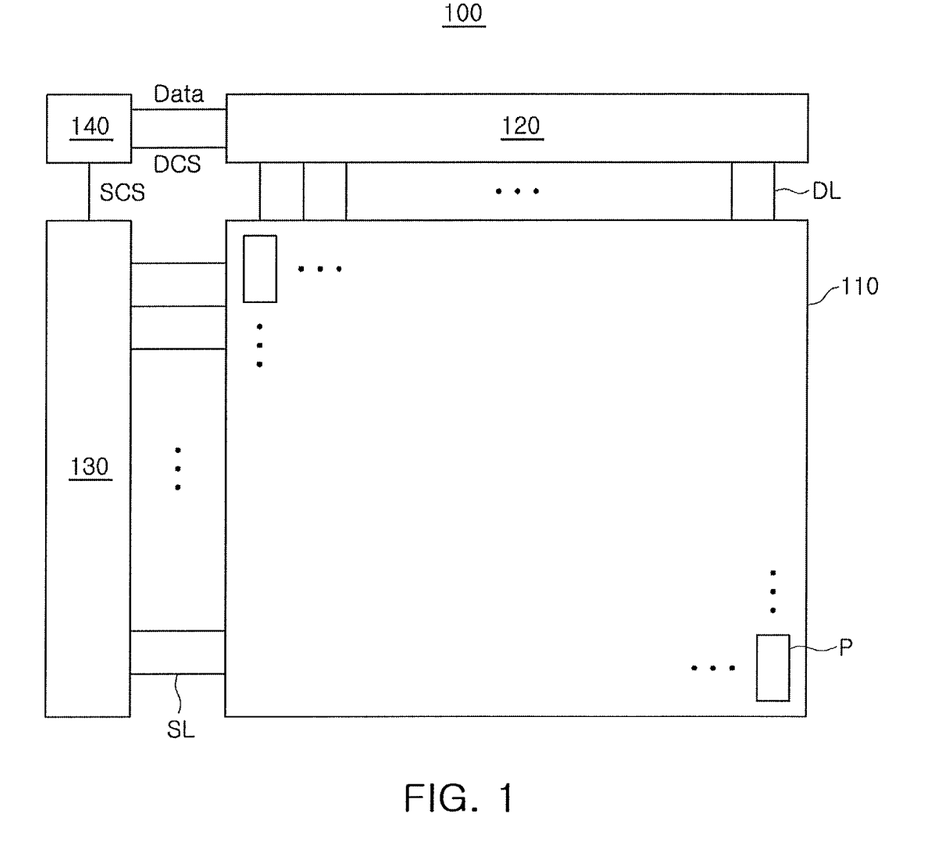
FIG. 1 illustrates a view of an organic light emitting display device according to an exemplary embodiment.

FIG. 1 illustrates an organic light emitting display device according to an exemplary embodiment. Referring to FIG. 1, an organic light emitting display device 100 according to an exemplary embodiment may include an organic light emitting display panel 110, a data driver 120, a scan driver 130, and a controller 140. The organic light emitting display panel 110 may include a plurality of data lines DL, a plurality of scan lines SL, and a plurality of pixels P.

The plurality of pixels P in the organic light emitting display panel 110 may include circuit elements, e.g., transistors. Each pixel P may include an organic light emitting diode OLED, and a circuit element, e.g., a driving transistor for driving the organic light emitting diode OLED. Structures of pixels according to exemplary embodiments will be described later in more detail with reference to FIGS. 2 to 6.

A data driver 120 may drive a plurality of data lines DL by supplying data voltages to the plurality of data lines DL. According to an example, the data driver 120 may include at least one source driver integrated circuit SDIC to drive a plurality of data lines DL.

A scan driver 130 may sequentially drive a plurality of scan lines SL by sequentially supplying scan signals to the plurality of scan lines SL. According to an example, the scan driver 130 may include at least one gate driver integrated circuit GDIC, e.g., a gate in panel (GIP) type, on the organic light emitting display panel 110. In this case, the GIP may be implemented by a low temperature polycrystalline silicon (LTPS), and thus it may have high driving characteristics with high electron mobility.

The controller 140 may control the data driver 120 and the scan driver 130 by supplying a control signal to the data driver 120 and the scan driver 130. Specifically, the controller 140 may receive various timing signals including a vertical synchronization signal Vsync, a horizontal synchronization signal Hsync, an input data enable DE signal, a clock signal CLK, and the like, together with image data, from external sources (e.g., host systems).

The controller 140 may generate a data driving control signal DCS and a scan driving control signal SCS in response to the received timing signals, and may supply the data driving control signal DCS to the data driver 120, and supply the scan driving control signal SCS to the scan driver 130. In addition, the controller 140 may re-align image data supplied from an external source, and supply the image data to the data driver 120.

The scan driver 130 may sequentially supply scan signals of an On voltage or an Off voltage to the plurality of scan lines SL, according to the control of the controller 140. When a portion of a scan line is driven by the scan driver 130, the data driver 120 may convert image data received from the controller 140 into an analog data voltage, and supply the data voltage to a plurality of data lines DL.

FIG. 1 illustrates that the data driver 120 is in one position (e.g., a position higher or lower than a position) of the organic light emitting display panel 110. Alternatively, the data driver 120 may be in both positions (e.g., positions higher and lower than a position) of the organic light emitting display panel 110.

In addition, FIG. 1 illustrates that the scan driver 130 is in one position (e.g., a left or right position) of the organic light emitting display panel 110, but is not limited thereto. Alternatively, the scan driver 130 may be in both positions (e.g., left and right positions) of the organic light emitting display panel 110.

Figure 2:
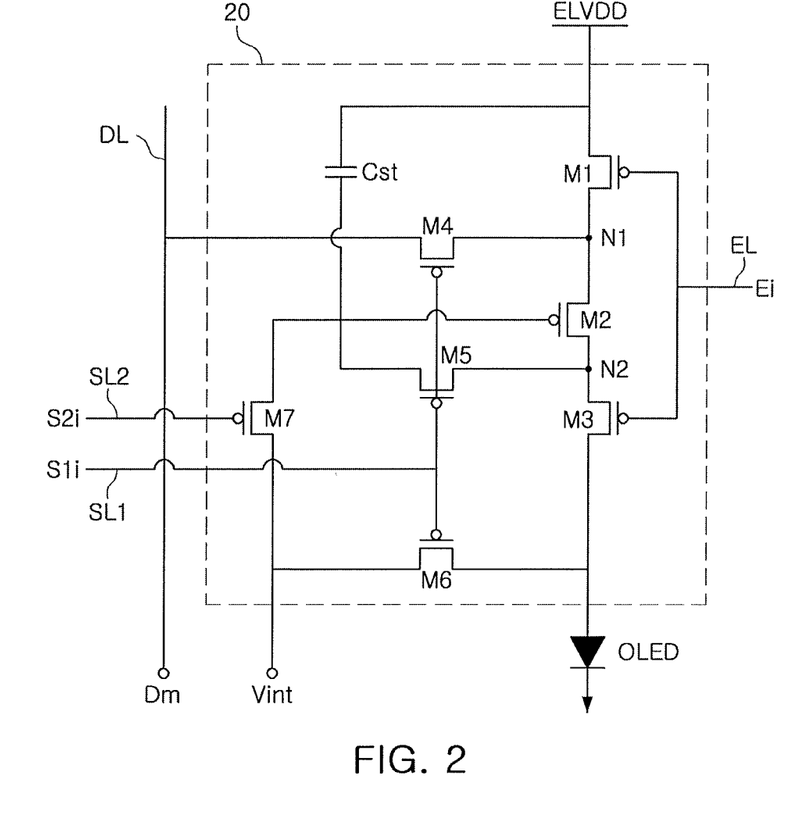
FIG. 2 illustrates a diagram of a structure of a pixel according to an exemplary embodiment.

FIG. 2 illustrates a structure of a pixel according to an exemplary embodiment. In FIG. 2, a case in which a pixel is located on the $i^{th}$ scan line, and connected to the $m^{th}$ data line is illustrated, but embodiments are not limited thereto. Referring to FIG. 2, a pixel according to an exemplary embodiment may include an organic light emitting diode OLED and a pixel circuit 20.

An anode electrode of the organic light emitting diode OLED may be connected to the pixel circuit 20, and may generate light having a predetermined luminance corresponding to an amount of current supplied from the pixel circuit 20.

The pixel circuit 20 may control an amount of current flowing from a driving power source ELVDD to the organic light emitting diode OLED in response to a data signal Dm. In this case, the pixel circuit 20 may include first to seventh transistors M1 to M7 and a storage capacitor Cst.

A first electrode of the first transistor M1 may be connected to the driving power source ELVDD, and a second electrode of the first transistor M1 may be connected to a first node N1. Further, a gate electrode of the first transistor M1 may be connected to a light emitting control line EL. The first transistor M1 may be turned off when a light emitting control signal E1 is supplied to the light emitting control line EL, and may be turned on when the light emitting control signal E1 is not supplied to the light emitting control line EL. The first transistor M1 may control an amount of current flowing from the driving power source ELVDD to the organic light emitting diode OLED in response to the light emitting control signal E1.

The second transistor M2 may be connected between the first node N1 and a second node N2. A gate electrode of the second transistor M2 may be connected to a second electrode of the seventh transistor M7.

The third transistor M3 may be connected between the second node N2 and an anode electrode of the organic light emitting diode OLED. A gate electrode of the third transistor M3 may be connected to the light emitting control line EL. The third transistor M3 may be turned off when the light emitting control signal E1 is supplied to the light emitting control line EL, and may be turned on when the light emitting control signal E1 is not supplied to the light emitting control line EL.

The fourth transistor M4 may be connected between the first node N1 and a data line DL. A gate electrode of the fourth transistor M4 may be connected to a first scan line SL1. The fourth transistor M4 may be turned on when a first scan signal S1$i$ is supplied to the first scan line SL1. When the fourth transistor M4 is turned on, the data line DL may be electrically connected to the first node N1.

The fifth transistor M5 may be connected between the second node N2 and the storage capacitor Cst. A gate electrode of the fifth transistor M5 may be connected to the first scan line SL1. The fifth transistor M5 may be turned on when the first scan signal S1$i$ is supplied to the first scan line SL1. When the fifth transistor M5 is turned on, the storage capacitor Cst may be electrically connected to the second node N2.

The sixth transistor M6 may be connected between an initialization power source Vint and the anode electrode of the organic light emitting diode OLED. A gate electrode of the sixth transistor M6 may be connected to the first scan line SL1. The sixth transistor M6 may be turned on when the first scan signal S1$i$ is supplied to the first scan line SL1. When the sixth transistor M6 is turned on, the initialization power source Vint may be supplied to the anode electrode of the organic light emitting diode OLED.

A first electrode of the seventh transistor M7 may be connected to the initialization power source Vint, and the second electrode of the seventh transistor M7 may be connected to the gate electrode of the second transistor M2. A gate electrode of the seventh transistor M7 may be connected to a second scan line SL2. The seventh transistor M7 may be turned on when a second scan signal S2$i$ is supplied to the second scan line SL2. When the seventh transistor M7 is turned on, the initialization power source Vint may be supplied to the gate electrode of the second transistor M2.

The storage capacitor Cst may be connected between the driving power source ELVDD and the fifth transistor M5.

The first to seventh transistors M1 to M7 may be formed of a P-type oxide semiconductor thin film transistor. In this case, a material of a channel layer of the P-type oxide semiconductor thin film transistor may include an indium tin gallium zinc oxide (InSnGaZnO)-based material which is a quaternary metal oxide; an indium gallium zinc oxide (InGaZnO)-based material, an indium tin zinc oxide (InSnZnO)-based material, an indium aluminum zinc oxide (InAlZnO)-based material, an indium hafnium zinc oxide (InHfZnO)-based material, a tin gallium zinc oxide (SnGaZnO)-based material, an aluminum gallium zinc oxide (AlGaZnO)-based material, a tin aluminum zinc oxide (SnAlZnO)-based material, which are ternary metal oxides; an indium zinc oxide (InZnO)-based material, a tin zinc oxide (SnZnO)-based material, an indium magnesium oxide (InMgO)-based material, an indium gallium oxide (InGaO)-based material, which are binary metal oxides; an indium oxide (InO)-based material, a tin oxide (SnO)-based material, a zinc oxide (ZnO)-based material, and the like. Compositional ratios of each element included in each of the above-described oxide semiconductor materials are not limited to specific ratios, and may be varied.

In addition, according to exemplary embodiments, the P-type oxide semiconductor may be in the form of back channel etch (BCE) or etch stop layer (ESL) in which a gate layer is a lower portion of a channel layer. Alternatively, the P-type oxide semiconductor may have a self-aligned structure in which a gate layer is disposed on a channel layer and a gate insulating film.

Therefore, when the first to seventh transistors M1 to M7 are formed of oxide semiconductor thin film transistors, voltage fluctuations due to a leakage current may be relatively reduced, and driving may be performed at a relatively low scanning rate. In addition, since it may not be necessary to provide a separate wiring line (for example, a clock wiring line for an N-type oxide semiconductor thin film transistor) by forming all of the first to seventh transistors M1 to M7 with a P-type oxide semiconductor thin film transistors, power consumption may be further reduced.

A method of realizing high luminance by setting a driving voltage to a low level, or a method of driving an organic light emitting display device at a low scanning rate, to relatively reduce power consumption, is used.

In particular, an organic light emitting device may output a high brightness with reduced power consumption by setting a driving voltage to be low or by using a low scanning rate. However, when a thin film transistor (TFT) made of low temperature polycrystalline silicon (LTPS) is used, it is difficult to drive the TFT at a low scanning rate due to a leakage current in a pixel. However, in accordance with embodiments, by using oxide semiconductor thin film transistors, the driving at a low scanning rate may be realized with a significantly reduced leakage current. Further, by using P-type oxide semiconductor thin film transistors, a simpler structure may be realized and power consumption may be further reduced.

Figure 3:
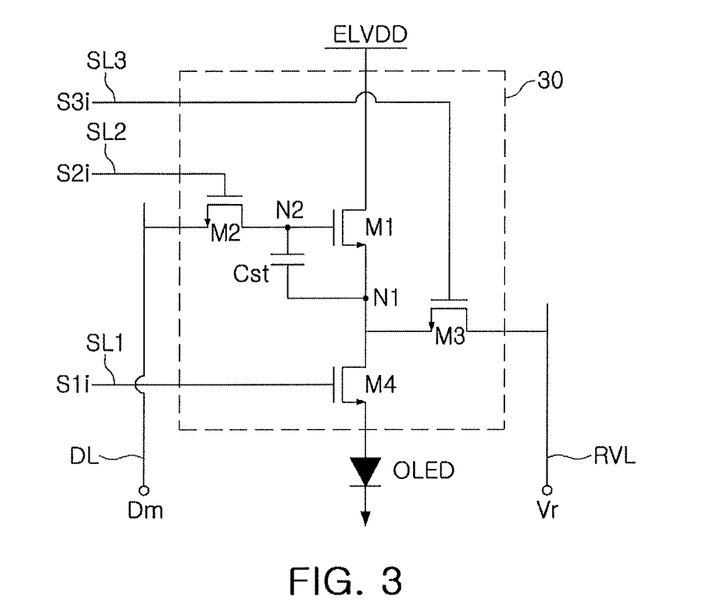
FIG. 3 illustrates a diagram of a structure of a pixel according to an exemplary embodiment.

FIG. 3 is a diagram illustrating a structure of a pixel according to an exemplary embodiment. Referring to FIG. 3, a pixel according to an exemplary embodiment may include an organic light emitting diode OLED and a pixel circuit 30.

An anode electrode of the organic light emitting diode OLED may be connected to the pixel circuit 30, and may generate light having a predetermined luminance corresponding to an amount of current supplied from the pixel circuit 30.

The pixel circuit 30 may control an amount of current flowing from a driving power source ELVDD to the organic light emitting diode OLED in response to a data signal. In this case, the pixel circuit 30 may include first to fourth transistors M1 to M4 and a storage capacitor Cst. In contrast to the pixel circuit 20, the pixel circuit 30 may have fewer transistors, and, instead of the light emitting control line EL, may be connected to a reference voltage line (RVL) and a third scan line SL3.

The first transistor M1 may include a first electrode connected to the driving power source ELVDD, a second electrode connected to a first node N1, and a gate electrode connected to a second node N2. The first transistor M1 may operate as a driving transistor (DRT) for driving the organic light emitting diode OLED by supplying a driving current to the organic light emitting diode OLED.

The second transistor M2 may be connected between a data line DL and the second node N2. A gate electrode of the second transistor M2 may be connected to a second scan line SL2. The second transistor M2 may be turned on when a second scan signal S2$i$ is supplied to the second scan line SL2. When the second transistor M2 is turned on, the data line DL may be electrically connected to the second node N2. The second transistor M2 may operate as a switching transistor (SWT) for transmitting a data signal to the second node N2, corresponding to the gate electrode of the first transistor M1.

The third transistor M3 may be connected between the first node N1 and the reference voltage line RVL for supplying a reference voltage Vr. A gate electrode of the third transistor M3 may be connected to the third scan line SL3. The third transistor M3 may be turned on when a third scan signal S3$i$ is supplied to the third scan line SL3. When the third transistor M3 is turned on, the first node N1 may be electrically connected to the reference voltage line RVL. The third transistor M3 may operate as a sensing transistor (SENT) electrically connecting the reference voltage line RVL and the first node N1.

The fourth transistor M4 may be connected between the first node N1 and the anode electrode of the organic light emitting diode OLED. A gate electrode of the fourth transistor M4 may be connected to the first scan line SL1. The fourth transistor M4 may be turned on when the first scan signal S1i is supplied to the first scan line SL1.

The storage capacitor Cst may be connected between the first node N1 and the second node N2.

The first to fourth transistors M1 to M4 may be formed of a P-type or an N-type oxide semiconductor thin film transistor, such that voltage fluctuations due to a leakage current may be relatively reduced, and driving may be performed at a relatively low scanning rate. Alternatively, all of the first to fourth transistors M1 to M4 may be formed of a P-type oxide semiconductor thin film transistor. Therefore, since it may not be necessary to provide a separate wiring line (for example, a clock wiring line for an N-type oxide semiconductor thin film transistor), power consumption may be further reduced.

Figure 4:
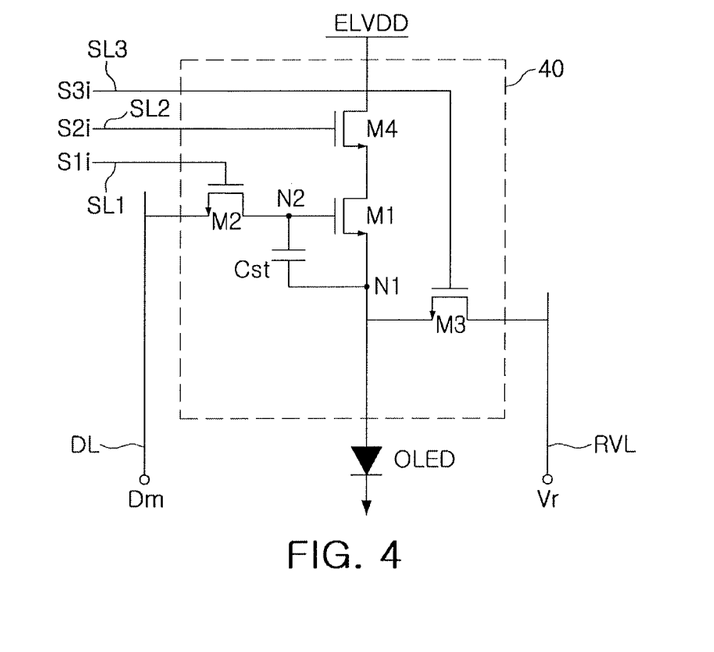
FIG. 4 illustrates a diagram of a structure of a pixel according to an exemplary embodiment.

FIG. 4 is a diagram illustrating a structure of a pixel according to an exemplary embodiment. Referring to FIG. 4, a pixel according to an exemplary embodiment may include an organic light emitting diode OLED and a pixel circuit 40.

An anode electrode of the organic light emitting diode OLED may be connected to the pixel circuit 40, and may generate light having a predetermined luminance corresponding to an amount of current supplied from the pixel circuit 40.

The pixel circuit 40 may control an amount of current flowing from a driving power source ELVDD to the organic light emitting diode OLED in response to a data signal. In this case, the pixel circuit 40 may include first to fourth transistors M1 to M4 and a storage capacitor Cst. The number of transistors in the pixel circuit 40 may be the same as that for the pixel circuit 30 and may be connected to the same lines as the pixel circuit 30, but in a different configuration.

A first electrode of the first transistor M1 may be connected to a second electrode of the fourth transistor M4, and a second electrode of the first transistor M1 may be connected to a first node N1. Further, a gate electrode of the first transistor M1 may be connected to a second node N2. The first transistor M1 may operate as a driving transistor (DRT) for driving the organic light emitting diode OLED by supplying a driving current to the organic light emitting diode OLED.

The second transistor M2 may be connected between a data line DL and the second node N2. A gate electrode of the second transistor M2 may be connected to a first scan line SL1. The second transistor M2 may be turned on when a first scan signal S1i is supplied to the first scan line SL1. When the second transistor M2 is turned on, the data line DL may be electrically connected to the second node N2. The second transistor M2 may operate as a switching transistor (SWT) for transmitting a data signal to a second node N2, corresponding to the gate electrode of the first transistor M1.

The third transistor M3 may be connected between the first node N1 and a reference voltage line RVL for supplying a reference voltage Vr. A gate electrode of the third transistor M3 may be connected to a third scan line SL3. The third transistor M3 may be turned on when a third scan signal S3i is supplied to the third scan line SL3. When the third transistor M3 is turned on, the first node N1 may be electrically connected to the reference voltage line RVL. The third transistor M3 may operate as a sensing transistor (SENT) electrically connecting the reference voltage line RVL and the first node N1.

The fourth transistor M4 may include a first electrode connected to the driving power source ELVDD, a second electrode connected to the first electrode, and a gate electrode connected to the second scan line SL2. The fourth transistor M4 may be turned on when a second scan signal S2i is supplied to the second scan line SL2. When the fourth transistor M4 is turned on, the driving power source ELVDD may be electrically connected to the first electrode of the first transistor M1.

The storage capacitor Cst may be connected between the first node N1 and the second node N2.

The first to fourth transistors M1 to M4 may be formed of a P-type or an N-type oxide semiconductor thin film transistor such that voltage fluctuations due to a leakage current may be relatively reduced, and driving may be performed at a relatively low scanning rate.

Alternatively, the first to fourth transistors M1 to M4 may be formed of a P-type oxide semiconductor thin film transistor. Therefore, since it may not be necessary to provide a separate wiring line (e.g., a clock wiring line for an N-type oxide semiconductor thin film transistor), power consumption may be further reduced.

Figure 5:
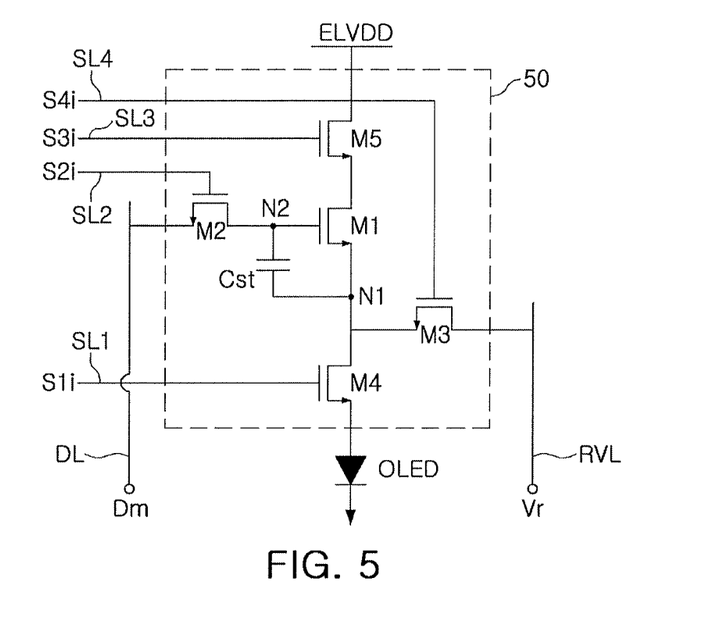
FIG. 5 illustrates a diagram of a structure of a pixel according to an exemplary embodiment.

FIG. 5 is a diagram illustrating a structure of a pixel according to an exemplary embodiment. Referring to FIG. 5, a pixel according to an exemplary embodiment may include an organic light emitting diode OLED and a pixel circuit 50.

An anode electrode of the organic light emitting diode OLED may be connected to the pixel circuit 50, and may generate light having a predetermined luminance corresponding to an amount of current supplied from the pixel circuit 50.

The pixel circuit 50 may control an amount of current flowing from a driving power source ELVDD to the organic light emitting diode OLED in response to a data signal. In this case, the pixel circuit 50 may include first to fifth transistors M1 to M5 and a storage capacitor Cst. The pixel circuit 50 may include an additional transistor and may be additionally connected to a fourth scanning line SL4, as compared to the pixel circuits 30 and 40.

The first transistor M1 may include a first electrode connected to a second electrode of the fifth transistor M5, a second electrode connected to a first node N1, and a gate electrode connected to a second node N2. The first transistor M1 may operate as a driving transistor (DRT) for driving the organic light emitting diode OLED by supplying a driving current to the organic light emitting diode OLED.

The second transistor M2 may be connected between a data line DL and the second node N2. A gate electrode of the second transistor M2 may be connected to a second scan line SL2. The second transistor M2 may be turned on when a second scan signal S2i is supplied to the second scan line SL2. When the second transistor M2 is turned on, the data line DL may be electrically connected to the second node N2. The second transistor M2 may operate as a switching transistor (SWT) transmitting a data signal to a second node N2, corresponding to a gate electrode of the first transistor M1.

The third transistor M3 may be connected between the first node N1 and a reference voltage line RVL for supplying a reference voltage Vr. A gate electrode of the third transistor M3 may be connected to the fourth scan line SL4. The third transistor M3 may be turned on when a fourth scan signal S4i is supplied to the fourth scan line SL4. When the third transistor M3 is turned on, the first node N1 may be electrically connected to the reference voltage line RVL. The third transistor M3 may operate as a sensing transistor (SENT) electrically connecting the reference voltage line RVL and the first node N1.

The fourth transistor M4 may be connected between the first node N1 and the anode electrode of the organic light emitting diode OLED. A gate electrode of the fourth transistor M4 may be connected to the first scan line SL1. The fourth transistor M4 may be turned on when a first scan signal S1i is supplied to the first scan line SL1.

The fifth transistor M5 may include a first electrode connected to the driving power source ELVDD, a second electrode connected to the first electrode of the first transistor M1, and a gate electrode connected to a third scan line SL3. The fifth transistor M5 may be turned on when a third scan signal S3i is supplied to the third scan line SL3. When the fifth transistor M5 is turned on, the driving power source ELVDD may be electrically connected to the first electrode of the first transistor M1.

The storage capacitor Cst may be connected between the first node N1 and the second node N2.

The first to fifth transistors M1 to M5 may be formed of a P-type or an N-type oxide semiconductor thin film transistor such that voltage fluctuations due to a leakage current may be relatively reduced, and driving may be performed at a relatively low scanning rate.

Alternatively, the first to fifth transistors M1 to M5 may be formed of a P-type oxide semiconductor thin film transistor. Therefore, since it may not be necessary to provide a separate wiring line (for example, a clock wiring line for an N-type oxide semiconductor thin film transistor), power consumption may be further reduced.

Figure 6:
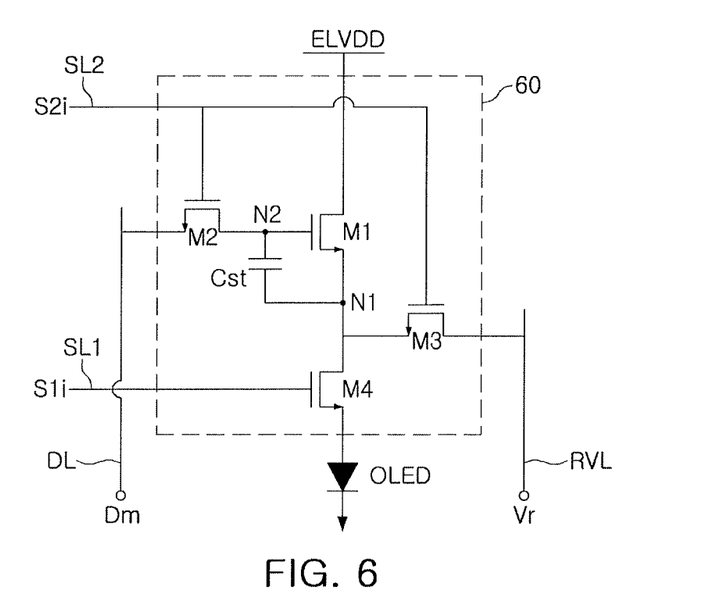
FIG. 6 illustrates a diagram of a structure of a pixel according to an exemplary embodiment.

FIG. 6 is a diagram illustrating a structure of a pixel according to an exemplary embodiment. Referring to FIG. 6, a pixel according to an exemplary embodiment may include an organic light emitting diode OLED and a pixel circuit 60.

An anode electrode of the organic light emitting diode OLED may be connected to the pixel circuit 60, and may generate light having a predetermined luminance corresponding to an amount of current supplied from the pixel circuit 60.

The pixel circuit 60 may control an amount of current flowing from a driving power source ELVDD to the organic light emitting diode OLED in response to a data signal. In this case, the pixel circuit 60 may include first to fourth transistors M1 to M4 and a storage capacitor Cst. The pixel circuit 60 has the same transistor arrangement as the pixel circuit 30, but is not connected to the third scan line SL3.

In the pixel circuit 60, gate electrodes of the second transistor M2 and the third transistor M3 may be connected to the same second scan line SL2 to commonly use a second scan signal S2i. In addition, since a structure of the pixel circuit 60 is the same as that of the pixel circuit 30 illustrated in FIG. 3, a duplicate description thereof will be omitted.

A structure of the pixel circuit 60 may be not necessarily limited thereto. For example, although the pixel circuit 60 in FIG. 6 illustrates that the second transistor M2 and the third transistor M3 are connected to the second scan line SL2 to commonly use the second scan signal S2i, based on the pixel circuit 30 illustrated in FIG. 3. The second transistor M2 and the third transistor M3 in the pixel circuits 40 and 50 illustrated in FIGS. 4 and 5 may also be connected to the same scan line to commonly use one scan signal.

According to exemplary embodiments, a pixel, and an organic light emitting display device including the pixel, capable of relatively reducing power consumption, may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel, comprising:
an organic light emitting diode;
a first transistor having a first electrode connected to a driving power source, a second electrode connected to a first node, and a gate electrode connected to a light emitting control line;
a second transistor connected between the first node and a second node, and having a gate electrode connected to a second electrode of a seventh transistor;
a third transistor connected between the second node and an anode electrode of the organic light emitting diode, and having a gate electrode connected to the light emitting control line;
a fourth transistor connected between the first node and a data line, and a having a gate electrode connected to a first scan line;
a fifth transistor connected between the second node and a storage capacitor, and having a gate electrode connected to the first scan line;
a sixth transistor connected between an initialization power source and the anode electrode of the organic light emitting diode, and having a gate electrode connected to the first scan line;
the seventh transistor having a first electrode connected to the initialization power source, a second electrode connected to the gate electrode of the second transistor, and a gate electrode connected to a second scan line; and
the storage capacitor connected between the driving power source and the fifth transistor, wherein the first transistor to the seventh transistor are P-type oxide semiconductor thin film transistors.

2. The pixel as claimed in claim 1, wherein a channel layer of the P-type oxide semiconductor thin film transistors is formed of at least one of an indium tin gallium zinc oxide (InSnGaZnO)-based material which is a quaternary metal oxide; an indium gallium zinc oxide (InGaZnO)-based material, an indium tin zinc oxide (InSnZnO)-based material, an indium aluminum zinc oxide (InAlZnO)-based material, an indium hafnium zinc oxide (InHfZnO)-based material, a tin gallium zinc oxide (SnGaZnO)-based material, an aluminum gallium zinc oxide (AlGaZnO)-based material, a tin aluminum zinc oxide (SnAlZnO)-based material, which are ternary metal oxides; an indium zinc oxide (InZnO)-based material, a tin zinc oxide (SnZnO)-based material, an indium magnesium oxide (InMgO)-based material, an indium gallium oxide (InGaO)-based material, which are binary metal oxides; an indium oxide (InO)-based material, a tin oxide (SnO)-based material, and a zinc oxide (ZnO)-based material.

3. A pixel, comprising:
an organic light emitting diode;
a first transistor, a second transistor, a third transistor, and a fourth transistor; and
a storage capacitor,
wherein:
the first transistor includes a first electrode connected to a driving power source, a second electrode connected to a first node, an electrode of the third transistor, and an electrode of the fourth transistor, and a gate electrode connected to a second node and an electrode of the second transistor;

the second transistor is connected between a data line and the second node, and has a gate electrode connected to a second scan line;

the third transistor is connected between the first node and a reference voltage line, and has a gate electrode connected to a third scan line;

the fourth transistor is connected between the first node and an anode electrode of the organic light emitting diode, and has a gate electrode connected to a first scan line;

the storage capacitor is connected between the first node and the second node, the first transistor to the fourth transistor are oxide semiconductor thin film transistors, and the first transistor to the fourth transistor are P-type oxide semiconductor thin film transistors.

4. An organic light emitting display device, comprising:

an organic light emitting display panel including a plurality of data lines, a plurality of scan lines, and a plurality of pixels;

a data driver driving the plurality of data lines by supplying a data voltage to the plurality of data lines;

a scan driver sequentially driving the plurality of scan lines by sequentially supplying scan signals to the plurality of scan lines; and a controller controlling the data driver and the scan driver by supplying a control signal to the data driver and the scan driver, wherein all transistors included in each of the plurality of pixels are P-type oxide semiconductor thin film transistors, and wherein each of the plurality of pixels includes:

a first transistor configured to receive a driving power source at a first electrode connected to a second electrode of a fifth transistor, and having a second electrode connected to a first node, and a gate electrode connected to a second node;

a second transistor having a first electrode connected to a data line, a second electrode connected to the second node, and a gate electrode connected to a second scan line;

a third transistor configured to connect a reference voltage line and the first node, and having a gate electrode connected to a fourth scan line;

a fourth transistor connected between the first node and an anode electrode of an organic light emitting diode, the fourth transistor having a gate electrode connected to a first scan line;

the fifth transistor, the fifth transistor including a first electrode connected to the driving power source, the second electrode connected to the first electrode of the first transistor, and a gate electrode connected to a third scan line;

a storage capacitor connected between the first node and the second node; and the organic light emitting diode, the organic light emitting diode being configured to receive a driving current supplied by the first transistor.

5. The organic light emitting display device as claimed in claim 4, wherein the second scan line and the fourth scan line are one common scan line.

6. The organic light emitting display device as claimed in claim 4, wherein the scan driver is implemented as a gate in panel (GIP) type of a low temperature polycrystalline silicon (LTPS).

7. The organic light emitting display device as claimed in claim 4, wherein the scan driver is in one position or both positions of the organic light emitting display panel.

8. The organic light emitting display device as claimed in claim 4, wherein the data driver is in one position or both positions of the organic light emitting display panel.

9. The pixel as claimed in claim 1, wherein the fourth, fifth, and sixth transistors receive a same signal on the first scan line such that the fourth, fifth, and sixth transistors are turned on together.

10. The organic light emitting display device as claimed in claim 4, wherein the third transistor is connected to the first node without any other transistors therebetween.

* * * * *